United States Patent [19]

Miyaguchi

[11] Patent Number: 5,757,427

[45] Date of Patent: May 26, 1998

[54] IMAGE PICK-UP APPARATUS HAVING A CHARGE COUPLED DEVICE WITH MULTIPLE ELECTRODES, A BUFFER LAYER LOCATED BELOW SOME OF THE ELECTRODES

[75] Inventor: Kazuhisa Miyaguchi, Hamamatsu, Japan

[73] Assignee: Hamamatsu Photonics K.K., Hamamatsu, Japan

[21] Appl. No.: 471,358

[22] Filed: Jun. 6, 1995

Related U.S. Application Data

[63] Continuation-in-part of Ser. No. 231,175, Apr. 22, 1994, abandoned.

[30] Foreign Application Priority Data

Apr. 23, 1993 [JP] Japan .................................. 5-097825

[51] Int. Cl.$^6$ ............................................ H04N 3/14
[52] U.S. Cl. ........................ 348/243; 348/312; 348/317
[58] Field of Search ............................ 348/317, 243, 348/311, 312

[56] References Cited

U.S. PATENT DOCUMENTS

| | | | |
|---|---|---|---|
| 3,932,775 | 1/1976 | Kosonocky | 348/322 |
| 4,031,315 | 6/1977 | Pfleiderer | 348/311 |
| 4,486,783 | 12/1984 | Tanaka et al. | 348/317 |
| 4,760,453 | 7/1988 | Hieda | 348/243 |
| 4,794,279 | 12/1988 | Yamamura et al. | 348/243 |
| 4,995,061 | 2/1991 | Hynecek | 348/314 |
| 5,008,758 | 4/1991 | Burke | 348/243 |
| 5,115,458 | 5/1992 | Burkey et al. | 348/243 |
| 5,325,412 | 6/1994 | Stekelenburg | 348/243 |

FOREIGN PATENT DOCUMENTS 62-76770  4/1987  Japan .

OTHER PUBLICATIONS

Saks, A Technique for Suppressing Dark Current Generated by Interface States in Buried Channel CCD Imagers, IEEE Electron Device Letters, vol. EDL-1, No. 7, Jul. 1980, pp. 131–133.

*Primary Examiner*—Wendy Garber
*Attorney, Agent, or Firm*—Cushman Darby & Cushman IP Group of Pillsbury Madison & Sutro LLP

[57] ABSTRACT

An image pickup apparatus having a charge coupled device which comprises charge transfer channels having a photoelectric conversion function and a charge transfer function of the present invention has the structure that the charge transfer channels comprise transfer electrodes formed and arranged on a channel layer for transferring signal charges along with a charge transfer direction and a barrier layer formed on a part of the channel layer region underneath the transfer electrodes, and further comprising a driver for applying the CCD, in a case of taking image, a pinning voltage to the all transfer electrodes, whereby signal charges generated by incident light are accumulated in potential wells equivalent to pixels generated in the channel layer region where the barrier layer is not formed, and in a case of transferring charges, for applying two-phase clock having a "L" level of a pinning voltage and a "H" level of a predetermined voltage higher than the pinning voltage is applied to the transfer electrodes to mix signal charges accumulated in the adjacent two potential wells, whereby each mixed signal is isolated and transferred.

8 Claims, 9 Drawing Sheets

CHARGE TRANSFER DIRECTION y →

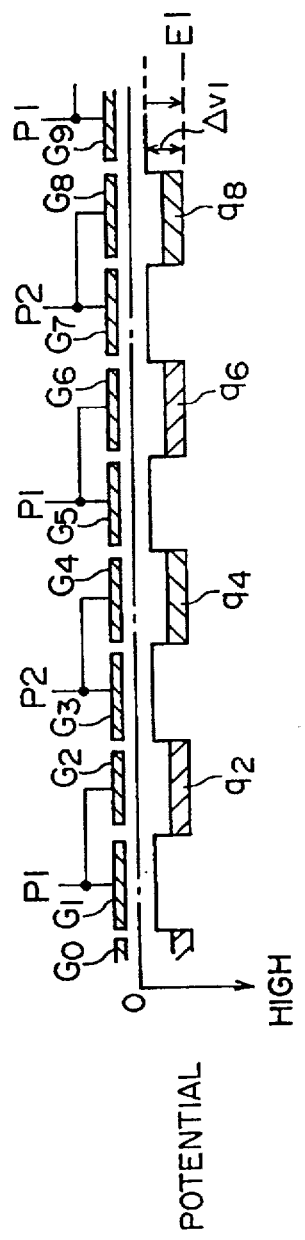
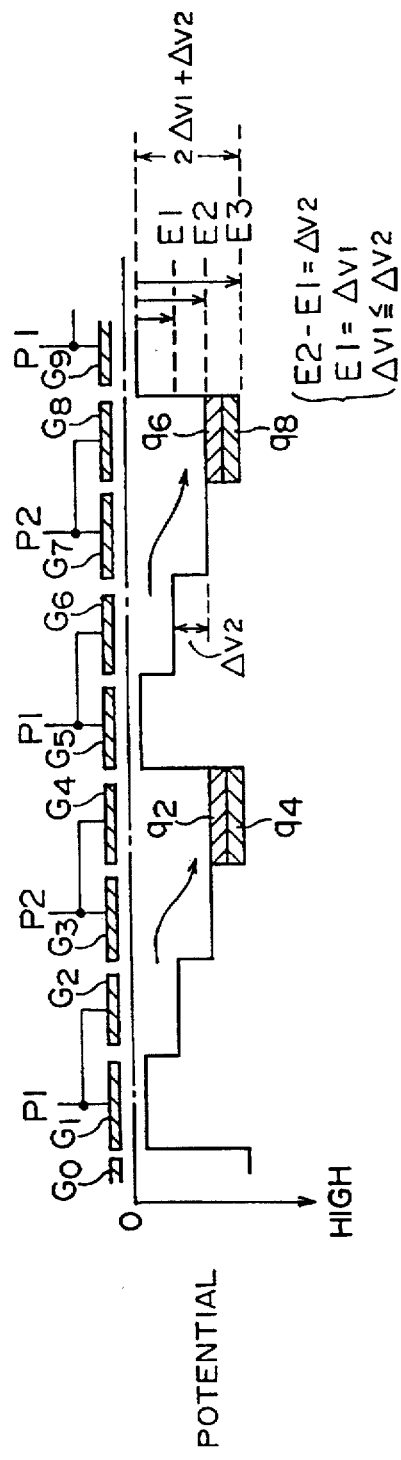
Fig.8A
Fig.8B

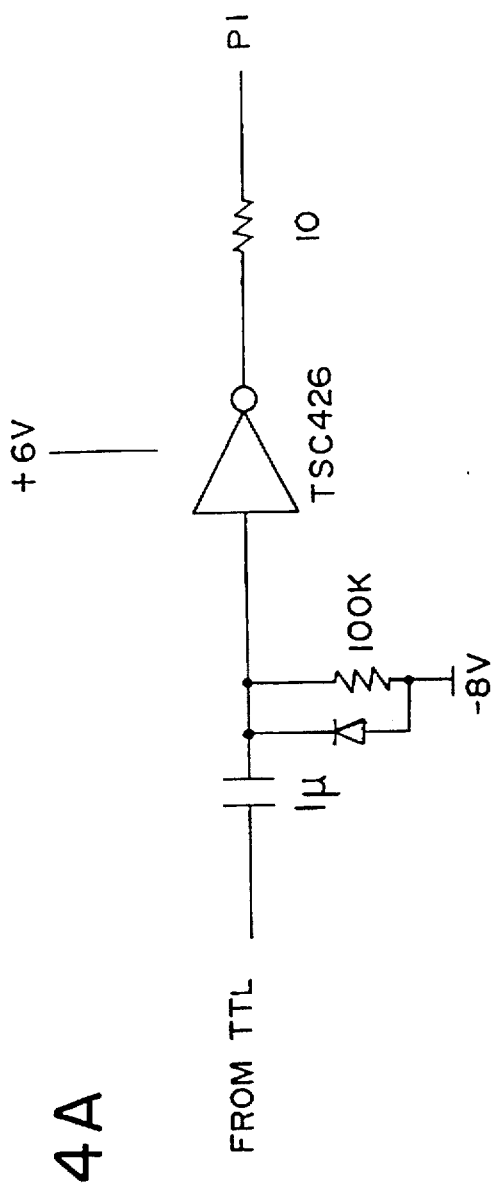
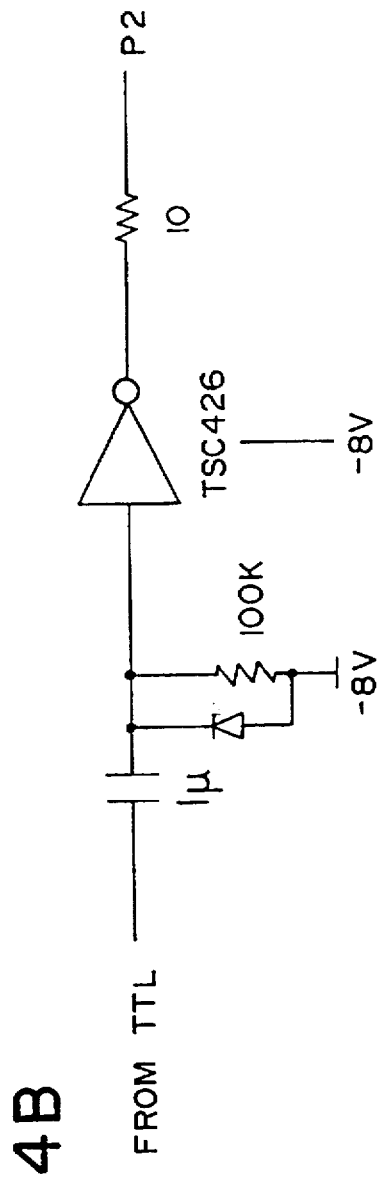
Fig. 14A
Fig. 14B

IMAGE PICK-UP APPARATUS HAVING A CHARGE COUPLED DEVICE WITH MULTIPLE ELECTRODES, A BUFFER LAYER LOCATED BELOW SOME OF THE ELECTRODES

RELATED APPLICATIONS

This is a Continuation-In-Part application of application serial No. 08/231,175 filed on Apr. 22, 1994, now abandoned.

BACKGROUND OF THE INVENTION

1. Field of the Invention

The present invention relates to an image pick-up apparatus having a charge coupled device, which can minimize noise by decreasing dark current generation even though light exposure occurs for prolonged periods.

2. Related Background Art

In recent years, charge-coupled device (CCD) solid image pickup apparatus (hereinafter simply called CCD) have been widely applied to public imaging devices such as a camera-integrated type VTR, or an electronic still camera because the CCD is small and has high mechanical integrity. Generally, either an inter-line transfer type (IT type) CCD or a frame-inter-line transfer type (FIT type) CCD is applied to these public imaging devices.

In an IT type CCD, photodiodes are formed and arranged into a matrix shape. Additionally, charge-transfer channels, which are arranged either horizontally or vertically, are formed adjacent to the photodiodes, and the surfaces of the charge-transfer channels shield the light. Signal charges accumulated in the photodiodes during light exposure are transferred to the charge-transfer channels and after synchronizing with predetermined read timing, the charge-transfer channels transfer the signal charges to output as pixel signals. Accordingly, in an IT type CCD the photodiodes receive light, and the charge-transfer channels are used only to transfer signal charges. Contrasted with an IT type CCD, the charge-transfer channels of a FIT type CCD both transfer and accumulate signal charges. Charge-transfer channels that accumulate signal charges occupy an accumulating region through which the pixel signal output is produced.

In a CCD utilizing the inter-line transfer function as described above, the photodiodes for receiving light and the charge-transfer channels for transferring charges are formed in different regions on the semiconductor chip. This produces a vignetting factor (the ratio of the area for pixel production to the area for receiving light) that limits the light condensing capability of the apparatus due to the inability of the charge-transfer channels to accumulate signal charges.

Frame transfer (FT) and full-frame transfer (FFT) types of CCDs utilize charge-transfer channels that have both charge transfer and photoelectric conversion functions, thereby improving the vignetting factor. Therefore, in a special measurement field characterized by low-level light intensity, e.g., light coming from a faraway star, the FT and FFT types of CCDs are more effective than are the inter-line transfer types of CCDs in condensing the available light for purposes of image analysis and reproduction.

The inventors of the present invention have studied and have developed an image-pick apparatus using CCDs that utilize the above described advantages of FT and FFT type CCDs in reproducing images from low-level light intensity sources. Consequently, the inventors of the present invention have determined that the following technical problems must be solved in order to achieve clear image reproduction.

First, referring to FIGS. 1 through 3, the structure and operation of the conventional FFT type and FT type CCDs will be described. In a CCD having a charge-transfer channel that provides both charge transfer and photoelectric conversion functions, as shown in FIG. 1, an n-type channel layer 2 is made on a p-type silicon substrate 1, and a plurality of transfer electrodes G0, G1, G2, . . . are formed, along a charge transfer direction, over a thin insulating layer. Next, four-phase clocks P1–P4 of the synchronizing wave form as shown in FIG. 2 are applied to these transfer electrodes G0, G1, G2, . . . .

Upon exposure to lights deep potential wells equivalent to the pixels are generated in the channel layer 2 underneath certain transfer electrodes. During transfer of the signal charges in the y-direction for output as pixel signals, signal charges accumulated in each potential well do not mix with signal charges from other potential wells.

Note that adjacent transfer electrodes are in groups of four (e.g., in FIG. 1: G1, G2, G3, and G4), and each group is equivalent to each pixel. For example, upon exposure to light, a high voltage clock P1 is applied to one specific transfer electrode in each group (e.g. in FIG. 1: G1 in a group of G1, G2, G3, and G4), whereas the low voltage clock pulses P2–P4 are applied to the remaining three transfer electrodes in each group (in FIG. 1: G2, G3, and G4). Consequently, a deep potential well is generated underneath the one transfer electrode D (in FIG. 1: G1) to accumulate the signal charges generated upon exposure to light; however, no deep potential well is generated underneath the other transfer electrodes, thereby ensuring isolation between the pixels.

Clock pulses P1 through P4 vary between high and low voltage at a certain cycle as shown in FIG. 2. While charges transfer, the varying potential profile shown in FIG. 3 ensures that charge transfer occurs without mixing signal charges from adjacent potential wells. The shaded portion of FIG. 3 represents signal charges for one pixel. FIG. 3 also shows the variation of the potential profile at points t1 through t4 as shown in FIG. 2.

In low-level light intensity situations in which conventional FFT and FT type CCDs must undergo prolonged periods of light exposure, a high voltage clock must be continuously applied to the transfer, electrode for long duration so as to generate a potential well equivalent to the pixel. Consequently, a clear image cannot be obtained because the magnitude of dark current increases.

Dark current has no effect when light exposure times are relatively short, as encountered with public imaging devices. However, in situations involving low-level light intensities that require long exposure times to ensure acceptable image reproduction, accumulated signal charges may be buried in dark currents.

SUMMARY OF THE INVENTION

It is an object of the present invention to provide an image pick-up apparatus having a CCD which can measure a two-dimensional image of low-level light intensity by suppressing the dark current generation even though light exposure time is prolonged.

It is further object of the present invention to provide an image pick-up apparatus having a charge coupled device, the charge coupled device having a transfer channels having a photoelectric conversion function and a charge transfer function; the charge transfer channels comprising transfer electrodes formed and arranged on a channel layer for transferring signal charges along with a charge transfer direction, and a barrier layer formed on a part of the channel layer region under the transfer electrodes; the apparatus further comprising a driver for driving said charge coupled device, said driver, in a case of taking image, applying a pinning voltage to said all transfer electrodes, whereby signal charges generated by incident light are accumulated in potential wells equivalent to pixels generated in the channel layer region where said barrier layer is not formed, and in a case of transferring charges, said driver circuit applying two-phase clocks having a "L" level of a pinning voltage and a "H" level of a higher predetermined voltage than the pinning voltage to said transfer electrodes to mix signal charges accumulated in the adjacent two potential wells, whereby each mixed signal is isolated and transferred.

In order to achieve this object, the image pick-up apparatus having the charge coupled device (CCD) of the present invention, which comprises charge-transfer channels having a photoelectric conversion function and a charge transfer function, has a structure in which the charge-transfer channels comprise transfer electrodes formed and arranged on a channel layer for transferring signal charges along the charge transfer direction and a barrier layer formed on that portion of the channel layer region directly underneath the transfer electrodes. During image reproduction, a pinning voltage is applied to all of the transfer electrodes, whereby signal charges generated by incident light are accumulated in potential wells equivalent to pixels generated in the channel layer region (potential well region) where the barrier layer is not formed. Each barrier layer region and its adjacent potential well region comprise a phase region.

Furthermore, for purposes of transferring charges, two-phase clocks having an "L" level pinning voltage and a "H" level predetermined voltage, which is higher than the pinning voltage, are applied to the transfer electrodes to mix signal charges accumulated in two adjacent potential wells, thereby isolating and transferring each mixed signal. During light exposure, such a configuration accumulates signal charges in the shallow potential wells thereby suppressing dark current generation. Therefore, noise due to dark current is reduced, and a clearer image is obtained. Furthermore, adjacent signal charges are mixed directly before the process proceeds from light receiving to charge transferring, so that a clear image with high contrast quality can be obtained.

Finally, two-phase driving mode clocks are introduced for purposes of mixing signal charges, however, these clocks are configured with respect to charge transfer so that any resultant degradation of image resolution can be maintained within an allowable range.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 8A and 8B show the potential profiles generated by the clocks shown in FIG. 7.

FIGS. 14A and 14B show another embodiment of a circuit for generating two-phase clocks P1 and P2 to be applied to the CCD.

DETAILED DESCRIPTION OF THE PREFERRED EMBODIMENTS

The embodiments of the present invention will be described hereunder with reference to the accompanying drawings.

First, referring to FIG. 4 and FIG. 5, one example of a CCD used in the embodiment according to the present invention will be explained.

Figure 12:
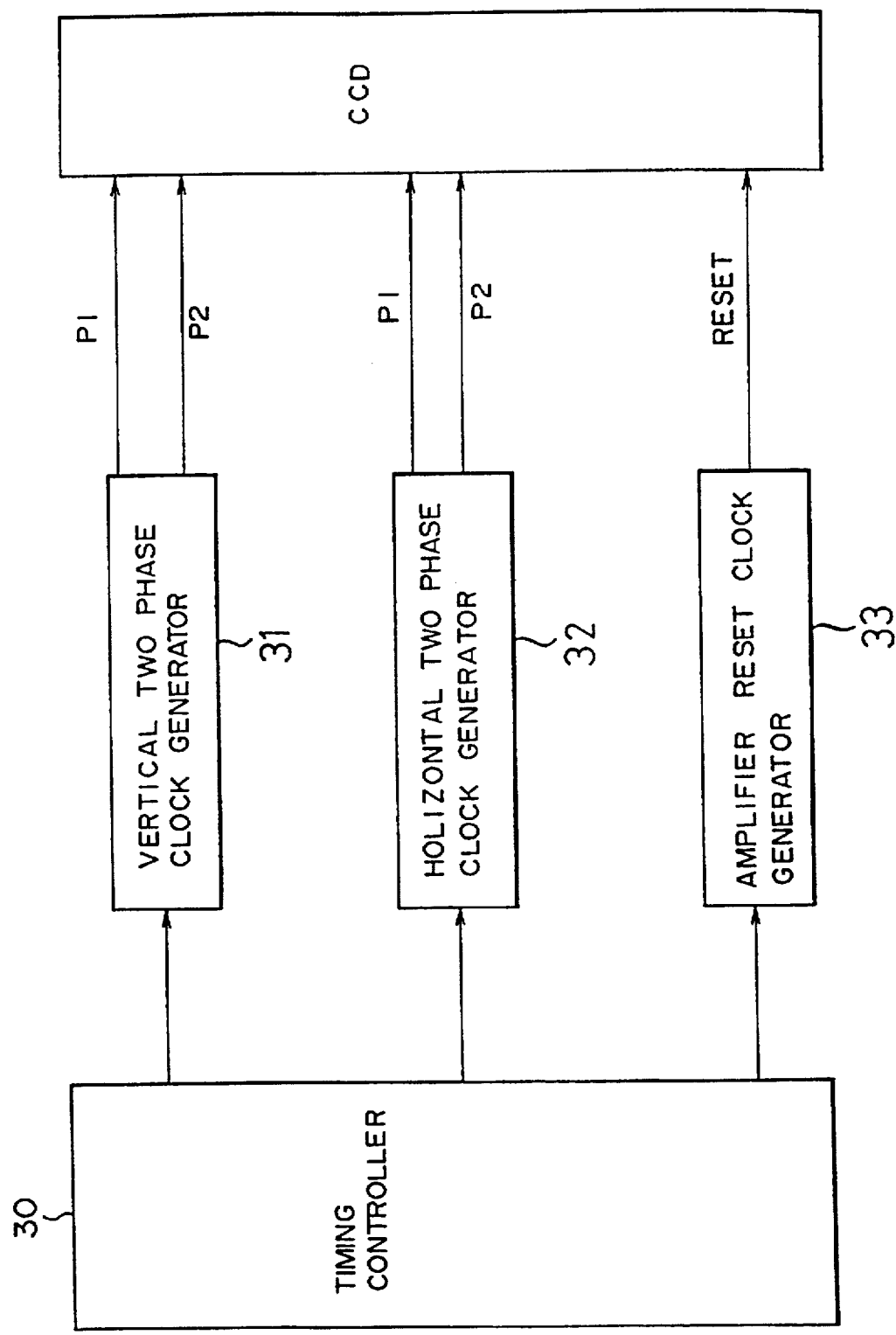
FIG. 12 shows a block diagram of a controller used in the embodiment according to the present invention.

An image pick-up apparatus according to the present invention comprises a CCD and a driving circuit for driving the CCD, as shown in FIG. 12. The driving circuit comprises a timing controller 30, a vertical two phase clock generator 31, a horizontal two phase clock generator 32 and an amp reset clock generator 33. Generally, the timing controller 30 is a digital circuit constituted by TTL (transistor-transistor-logic), PROM (programmable read only memory) and PLD etc. and it is a circuit for generating a logic amplitude so called as a TTL level. Timing pulse for controlling the CCD is generated in the timing controller and the generated pulse is applied to the vertical two phase clock generator 31, the horizontal two phase clock generator 32 and the amp reset clock generator 33 for applying a amp reset clock to the CCD.

In this embodiment, a voltage needed for pinning the CCD is about −4 V in barrier phase thereof and in accumulation phase, it is about −8 V. Therefore, −8 V which is smaller than −4 V is selected as a pining voltage. Further, in period for transfer of signal charge, it is necessary to keep +6 V which is higher than the pinning voltage as a high level.

Accordingly it is necessary to respectively generate clock pulses having these two voltages as respective signal level.

Figure 13A:
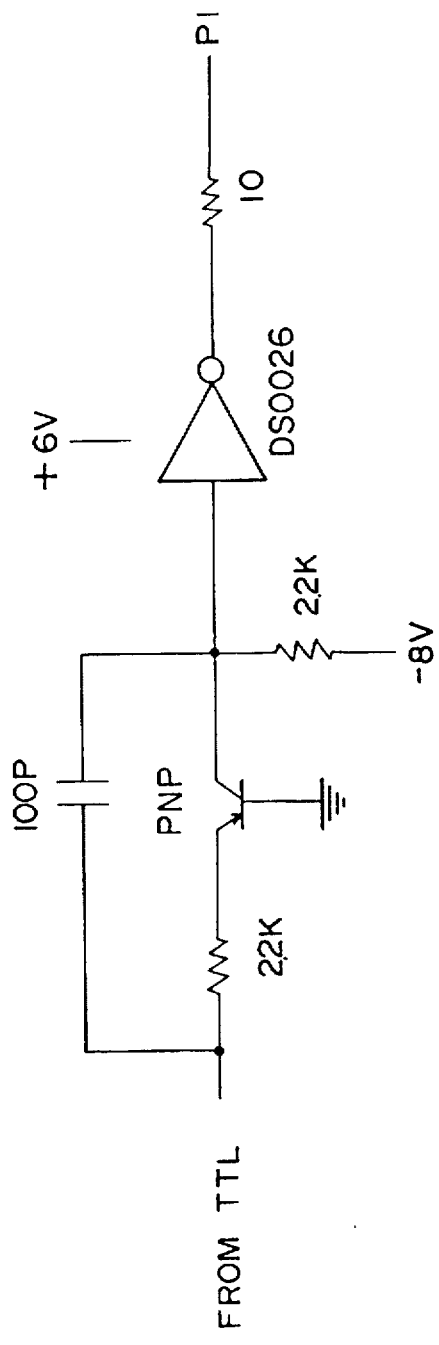
FIGS. 13A and 13B show one embodiment of a circuit for generating two-phase clocks P1 and P2 to be applied to the CCD.
Figure 13B:
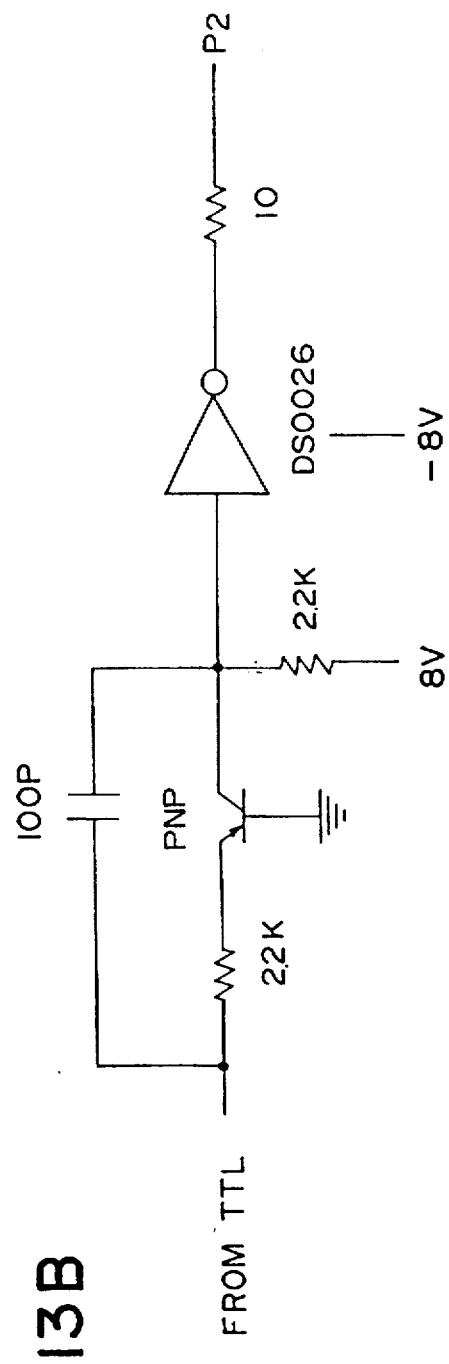

FIGS. 13A and 13B show an embodiment for performing the above. The embodiment is a clock generator and can convert TTL level signal into a clock pulse in which the pinning voltage is in a low level. A pulse from the clock generator is finally applied to a shift register of the CCD. Further FIGS. 14A and 14B show level convertor and in the arrangements shown in FIGS. 14A and 14B, the pinning voltage generator is constituted by a single capacitor, resister, diode, and a driver which is TSC 426 produced by Teledyne Ltd. DS0026 produced by National Semiconductor Ltd. or MAX626 produced by Maxim Ltd. It is also possible to constitute the level convertor using general NPN or PNP transistor.

Using the above pinning voltage generator, the control for the CCD is performed.

Next, the structure of the CCD and the timing will be explained below.

Figure 1:
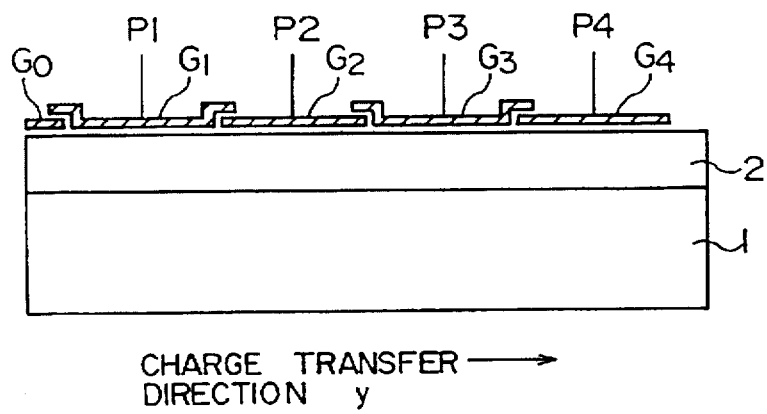
FIG. 1 is a view of the configuration and the operation of a conventional CCD image pickup apparatus.
Figure 2:
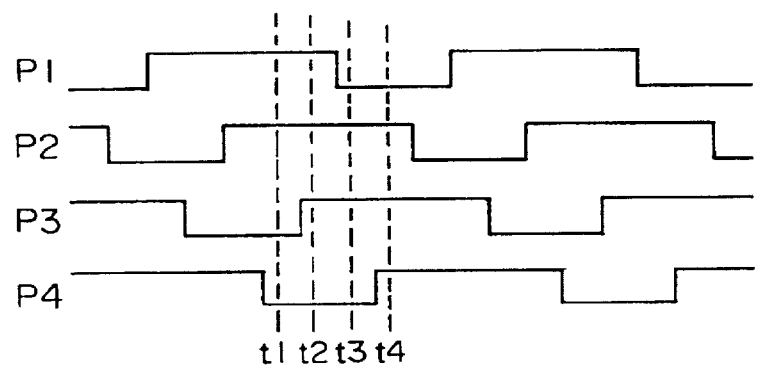
FIG. 2 shows the synchronizing wave form of the four phase clocks P1–P4 applied to transfer electrodes during the operation of a conventional CCD image pickup apparatus.
Figure 3:
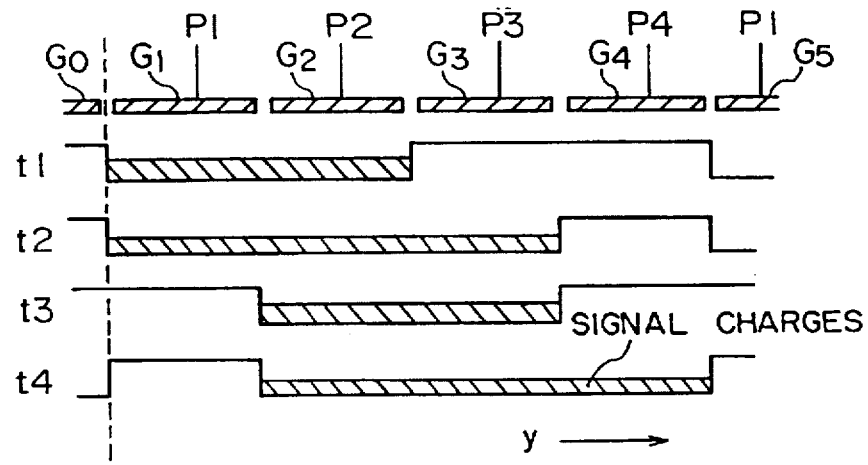
FIG. 3 is a view of the operation of a conventional CCD image pickup apparatus.
Figure 4:
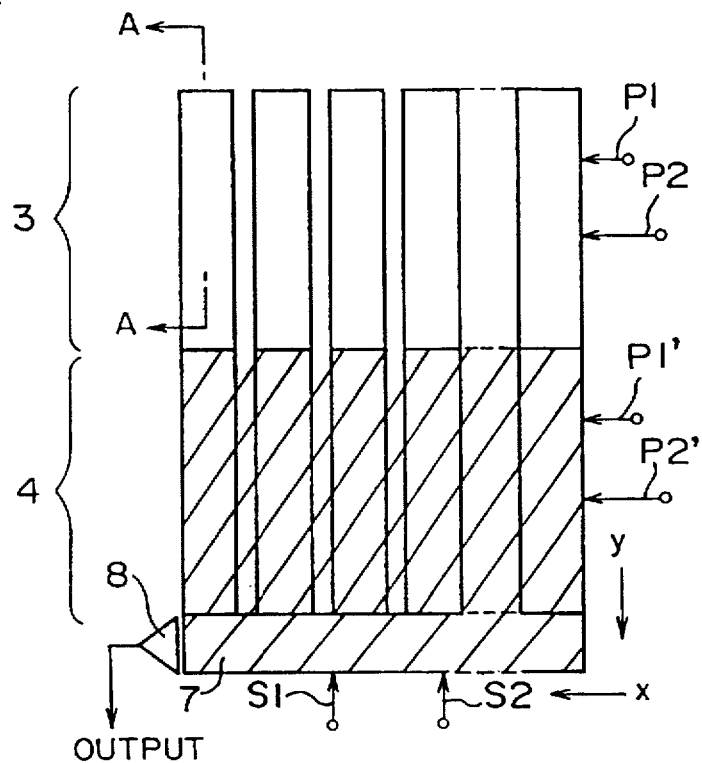
FIG. 4 is a configuration of a CCD solid image-pickup apparatus according to one embodiment of the present invention.

The CCD shown in FIG. 4 is a FT type CCD that does not have an inter-line function but, rather, comprises an imaging area 3 including a plurality of rows of charge-transfer channels having both photoelectric conversion and charge-transfer functions; a storage area 4 including; charge-transfer channels that are consecutively formed at the distal ends of the storage area 4 and the surfaces of which shield the light; a horizontal charge-transfer channel 7, which is formed at the ends of the charge-transfer channels of the storage-area 4 and the surface of which shields the light, for horizontally transferring signal charges from the storage area 4 in a horizontal direction x in accordance with horizontal two-phase clocks S1 and S2; and an output area 8 provided, at the distal end of the horizontal charge-transfer channel 7, for converting signal charges for each pixel into a voltage pixel signal.

Figure 5:
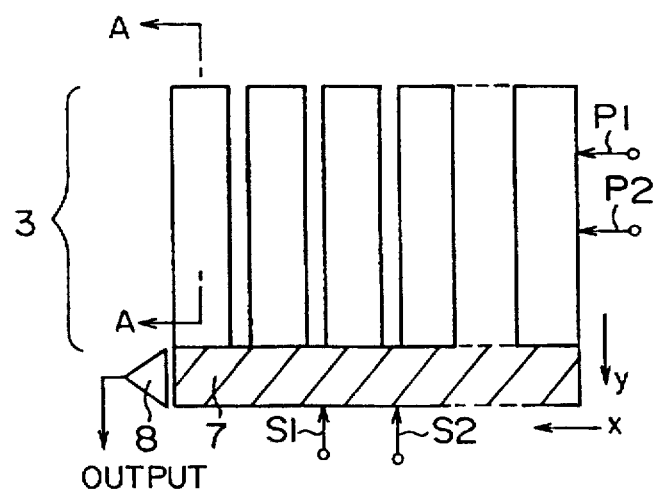
FIG. 5 is a configuration of a CCD solid image pickup apparatus according to another embodiment of the present invention.

On the other hand, the CCD shown in FIG. 5 is a FFT type, which comprises neither the inter-line function of the inter-line transfer types of CCDs nor the storage area 4 of the FT type CCD and which also differs from the FT type of FIG. 4 in that the horizontal charge-transfer channel 7 is directly connected to the distal ends of the charge-transfer channels of the imaging area 3.

Next, referring to FIG. 6, the structure of the charge-transfer channels provided at the imaging area 3 of FT and FFT types of CCDs will be explained. Note that FIG. 6 shows the detailed structure of a cross section 6—6 of the charge-transfer channels of FIG. 4 and FIG. 5.

Figure 6:
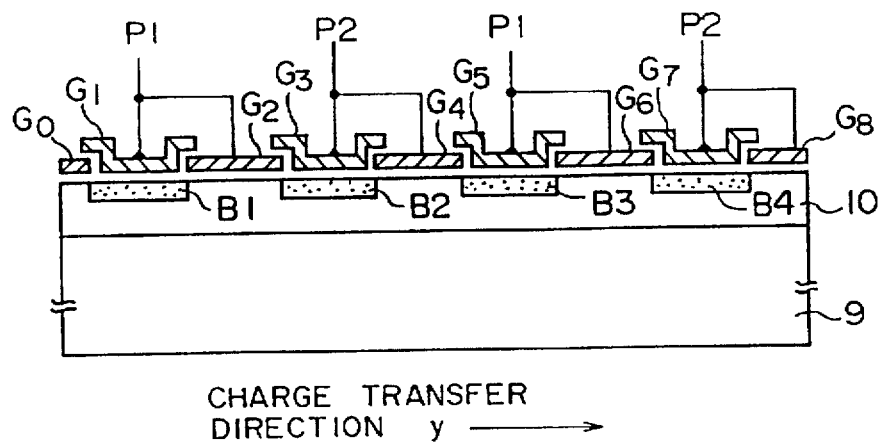
FIG. 6 is a view of cross-section 6—6 of the charge-transfer channels of FIG. 4 and FIG. 5.

In FIG. 6, an n-type channel layer is made on a p-type silicon substrate 9, and a plurality of transfer electrodes G0, G1, G2 . . . are formed in a row along the vertical charge transfer direction over a thin insulating layer. Furthermore, barrier regions B1, B2, B3, . . . are formed along the surface area of the channel layer underneath the odd number transfer electrodes G1, G3, G5"" by diffusing or doping either a p-type or a n-type impurity.

These transfer electrodes G0, G1, G2 . . . are then paired (in FIG. 6: G1 and G2, G3 and G4, G5 and G6, and G7 and G8 are pairs). To each pair of electrodes, vertical two-phase clocks P1 and P2 are applied in alternating fashion. Note that each transfer electrode G0, G1, G2, . . . is formed on the other transfer electrode in the same pair, and the two-phase clocks P1 and P2 are applied in alternating fashion to each pair of electrodes.

Next, referring to FIG. 7, a time chart of the vertical two-phase clocks P1 and P2 will be explained.

This timing control is performed by a controller shown in FIG. 12.

First, in the accumulation period τ1, both clock pulses P1 and P2 are kept at a certain low voltage (hereinafter called "L" level) $V_L$.

Figure 9:
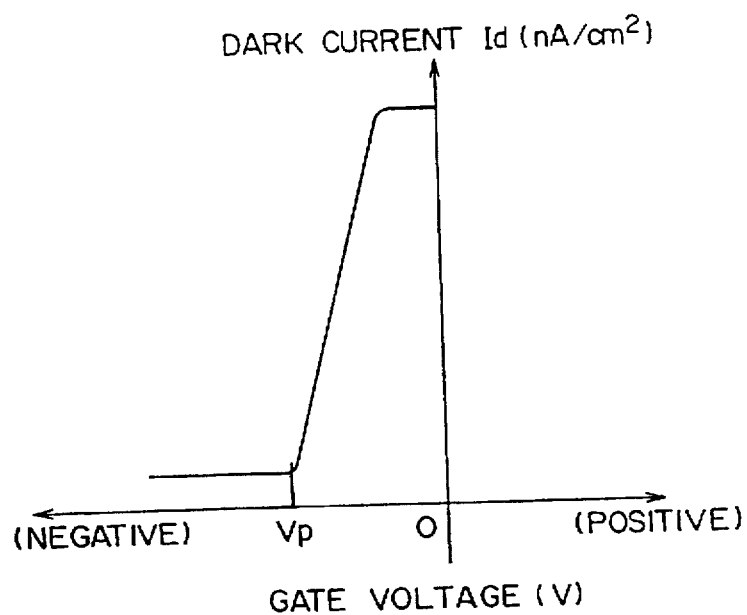
FIG. 9 is a graph showing the relationship between a gate voltage to be applied to transfer electrodes and dark current density.

Here, the "L" level voltage $V_L$ is determined based on the CCD characteristics derived from FIG. 9. FIG. 9 graphs experimental results showing the relationship between a gate voltage $V_G$ (volts), which is applied to the transfer electrodes, and a dark current density Id ($nA/cm^2$). FIG. 9 indicates a CCD characteristic that, as the gate voltage $V_G$ decreases, the dark current density Id decreases. Decrease of the dark current density Id stops when the gate voltage VG equals a pinning voltage $V_P$. Therefore, to minimize dark current density a "L" level voltage $V_L$, which is lower than the pinning voltage $V_P$, must be selected. On the other hand, in the case of vertical charge transfer, which will be described later, the clock pulses P1 and P2 are alternately varied between the "L" level voltage $V_L$ and the "H" level voltage, which is higher than the "L" level voltage $V_L$. This variation generates the potential profiles whereby charges are transferred.

In the two-phase shift CCD used in the image pick-up apparatus of the present invention, the difference between the potential of the barrier region (B1, B3, B5, B7, . . . ) underneath the odd numbered transfer electrodes and the potential of the region beneath the even numbered transfer electrodes in which signal charges q2, q4, q6, . . . are accumulated is ΔVI as shown in FIG. 8A. Accordingly, the relationship between gate voltage and dark current density depicted in FIG. 9 is different for the barrier region (beneath transfer electrodes G1, G3, G5, G7, . . . ) and the region (beneath transfer electrodes G2, G4, G6, G8, . . . ) in which signal charges accumulate.

Pinning voltage $V_P$, at which dark current density is minimized, is therefore different for the barrier and signal charge accumulation regions. As gate voltage becomes more negative, the barrier region is pinned first; with further decrease of the gate voltage, the signal charge accumulation regions are then pinned. This produces different potential profiles under the odd and even transfer electrodes. Furthermore, during the accumulating period τ1 shown in FIG. 7, the voltage $V_L$, at which both regions are pinned, is applied to P1 and P2 as a gate voltage. Notwithstanding application of this gate voltage, because of the potential difference ΔVI between the barrier and signal charge accumulation regions, signal charges limited by this potential difference can be accumulated.

Figure 7:
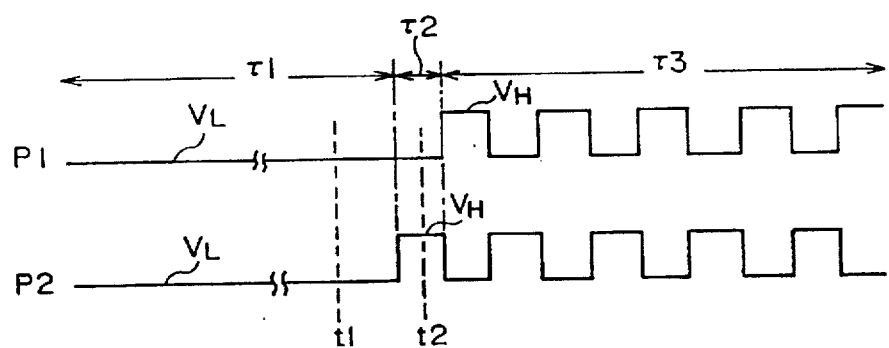
FIG. 7 is a time chart of clocks for driving a charge-transfer channel.

In FIG. 7, while clocks P1 and P2 are kept at "L" level during the accumulation period τ1, (eg at $t_1$), the potential profile is that shown in FIG. 8A. That is, the potential well is not generated at the regions beneath odd numbered gate electrodes where the barrier regions B1, B3, B5, . . . are formed, whereas the comparatively shallow potential wells of potential El in accordance with the "L" level voltage $V_L$ are generated at the regions beneath even numbered gate electrodes where the barrier regions are not formed.

Despite creation of these comparatively shallow potential wells upon application of the "L" level voltage $V_L$, because the $V_L$ selected is lower than the pinning voltage $V_P$, dark current generation is minimized as seen in FIG. 9. Signal charges q2, q4, q6, q8, . . . generated during the light exposure period T1 are accumulated in these potential wells.

Next, during the vertical charge transfer period (τ2+τ3), as shown in FIG. 7, the clocks P1 and P2 are alternately varied periodically between the "L" level voltage VL and the "H" level voltage $V_H$. Note that the clocks P1 and P2 are varied in complementary fashion.

Initially, during a period τ2, e.g., at t2' where clock P1 remains at the "L" level and clock P2 is inverted to the "H" level (hereinafter called the charge-mixing period) as shown in FIG. 8B, the potential profile corresponding to the pairs of the transfer electrodes (G1, G2)' (G5' G6) "" which remain at "L" level, does not vary from the profile in FIG. 8A. However, the potential profile corresponding to the pairs of transfer electrodes (G3' G4), (G7, G8), . . . which are changed to "H" level, becomes deep. Accordingly, the potential E3 of wells that are beneath transfer electrodes G4, G8, in locations where barrier regions are not formed becomes largest and the well, correspondingly, becomes deepest. Additionally, well potential E3, which is the difference between the potential of the barrier regions and the potential of the deepest potential well generated in the channel layer during the charge transferring period, is at least three times greater than well potential E1, which is the difference between the potential of the barrier regions and the potential of the potential well generated in the channel layer when pinning voltage is applied during the image taking period. As seen in FIG. 8B, the potential of wells beneath transfer electrodes G3, G7, . . . increases to E2, the regions under transfer electrodes G1, G5, . . . remain as barrier regions, and adjacent signal charges q2 and q4 mix as do adjacent signal charges q6 and q8.

Note that the relationship among well potentials in FIG. 8B is E1=E3–E2≦E2–E1, which is actualized by adjusting the impurity concentrations of barrier regions B1, B3, B5, B7, . . . .

If this well potential relationship is maintained, the potential well does not become extremely deep, so that the effects of dark currents can be suppressed.

Here, the remarkable point is that, during the accumulation period τ1, setting clocks P1 and P2 to low voltage $V_L$ in order to suppress dark current Id generation, as shown in FIG. 8A, results in not only a shallow potential well but also a decrease in the amount of signal charge that may be accumulated. However, during the charge-mixing period τ2, two adjacent signal charges are mixed to increase the total signal charge associated with each pixel, thereby resulting in a clear image. Ordinarily, this signal charge-mixing process decreases by one-half the sensor resolution obtained during accumulation period τ1, however, applying two-phase clocks P1 and P2 prevents the number of potential wells corresponding to transfer electrodes from sharply decreasing so that sensor resolution is not substantially lowered in the two-phase shift CCD of the present invention as compared to the conventional four-phase shift CCD.

As shown during charge transferring period τ3 of FIG. 7, the clocks P1 and P2 in complementary fashion are applied to the transfer electrodes G0, G1, G2, . . . so that the potential profile, which isolates the pixels and which is similar to the profile shown in FIG. 8B, is alternately varied, thereby isolating and then transferring every mixed signal charge.

Note that in the FT type CCD shown in FIG. 4, the charge-transfer channels of the storage area 4 also operate to transfer charges in the same way, so that the signal charges are gradually stored in the storage area 4.

On the other hand, in the FFT type CCD shown in FIG. 5, every time the signal charges for one row are transferred from the charge-transfer channel, the horizontal charge-transfer channel 7 repeats the horizontal charge-transfer operation, synchronizing with clocks S1 and S2 having a horizontal predetermined cycle, so that reading of the signal charges is possible.

Further, in the FT type CCD shown in FIG. 4, the charge-transfer channels of the storage area 4 and the horizontal charge-transfer channel 7 perform the same transferring operation as that of the FFT type CCD of FIG. 5 to output the signal charges for one frame, which formerly were stored in the storage area 4.

Thus, according to this embodiment of the present invention, during accumulation period τ1; signal charges accumulated in the shallow potential wells can suppress the dark current generation, so that noise due to dark currents is reduced and a clear image is thereby obtained. Furthermore, directly before the process proceeds from accumulation period τ1 to the charge transferring period τ3, adjacent signal charges are mixed so that a clear image with high contrast quality can be obtained. Finally, the two-phase driving mode clocks P1 and P2 are applied and are configured with respect to charge transfer so that, even though adjacent signal charges are mixed, degradation of image resolution can be maintained within an allowable range.

Note that in this embodiment, as shown in FIG. 6, the potential profile which isolates pixels is generated by selectively diffusing or doping ions to form the barrier regions in the channel layer, however, the present invention is not limited to this particular isolating means. For example, potential profile generation may be actualized through formation, within the CCD manufacturing process, of different thicknesses of gate oxide between the channel layer 10 and each transfer electrode corresponding to the pixel arrangement.

Figure 10:
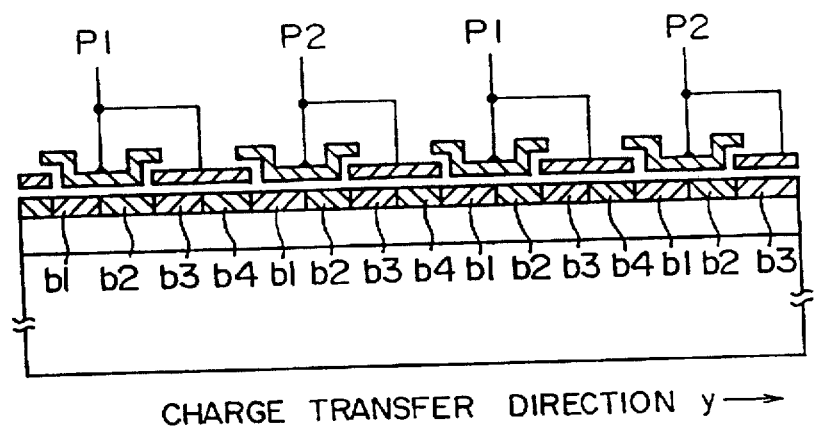
FIG. 10 is a sectional view showing a configuration of a charge-transfer channel according to another embodiment of the present invention.

Furthermore, in this embodiment the impurity concentration is uniform for all barrier regions, and a barrier region and a channel region which has no barrier region, are formed alternatingly along the charge transfer direction y. However, as shown in FIG. 10, a plurality of regions, each of composition b1, b2, b3, and b4 and each having impurity concentrations that are different from one other, may be formed beneath each pair of transfer electrodes along the charge transfer direction y.

Figure 11A:
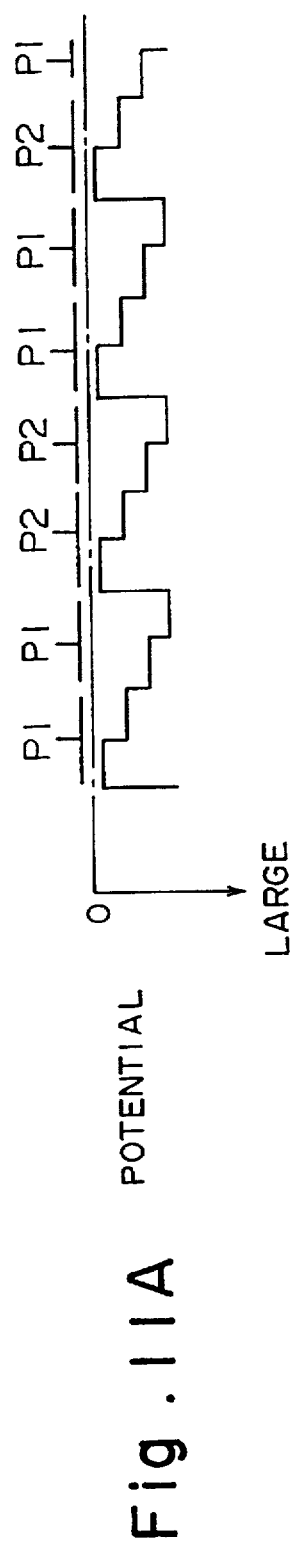
FIGS. 11A and 11B show the potential profiles generated in a charge-transfer channel according to another embodiment of the present invention.
Figure 11B:
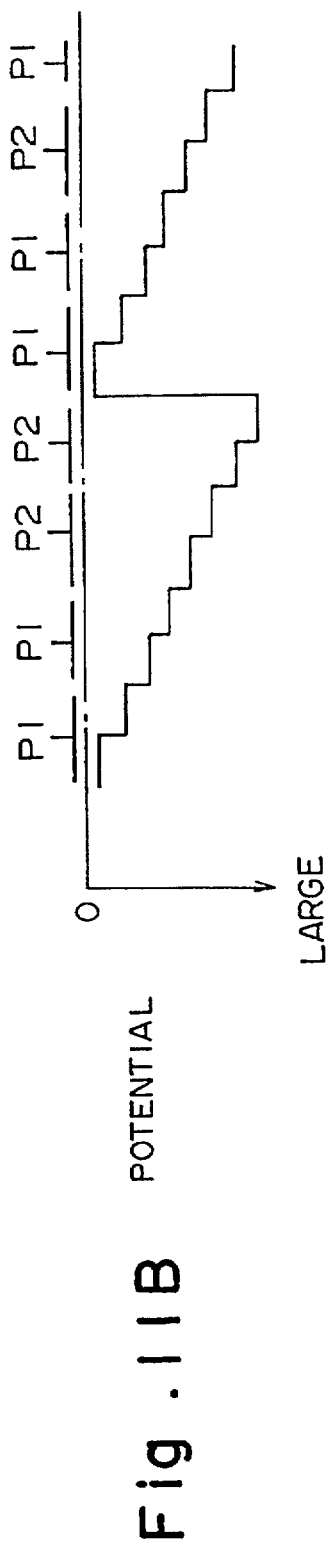

With such a configuration, when clocks P1 and P2 are both pinning voltage during the accumulation period, the potential profile becomes that shown in FIG. 11A and the range of the potential well for accumulating signal charges becomes wider. In the charge transferring period, as shown in FIG. 11B, the potential profile under the potential well corresponding to each pixel is blunt, so that the remaining charges can be decreased.

Therefore, the configuration of the charge coupled device (CCD) used in the apparatus according to the present invention can be described in the following manner. While an image is being taken, a pinning voltage is applied to all transfer electrodes to accumulate signal charges, generated by incident light, in potential wells equivalent to the pixel and generated in the channel layer region in which no barrier layer is formed. During charge transfer, two-phase clocks with "L" level pinning voltage and "H" level voltage higher than the pinning voltage are applied to these transfer electrodes to mix the signal charges accumulated in two adjacent potential wells and to transfer these mixed signal charges. During light exposure, such a configuration accumulates signal charges in shallow potential wells, thereby suppressing dark current generation. Consequently, noise due to dark currents is reduced and a clear image is thereby obtained.

Furthermore, two adjacent signal charges are mixed directly before the process proceeds from charge accumulation to charge transferring, so that a clear image with high contrast quality can be obtained. Finally, two-phase driving mode clocks are introduced and are configured with respect to charge transfer so that, even though adjacent signal charges are mixed, degradation of image resolution can be maintained within an allowable range.

Application of the image-pick up apparatus of the present invention to a special measurement field of low-level light intensity that requires prolonged light exposure will ensure acceptable image reproduction by minimizing the adverse effects of dark current.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An image pick-up apparatus comprising:
    a charge coupled device, said charge coupled device including:
        a substrate,
        a channel layer formed in the substrate, for transferring signal charge generated in the device in response to an incident light along with a charge transfer direction,
        a first transfer electrode group formed on said channel layer and having a first electrode and a second electrode,
        a second transfer electrode group formed on said channel layer and having a third electrode and a fourth electrode, and
        a barrier layer group formed in said channel layer and located under said first and third electrode but not located under said second and fourth electrodes; and
    a driver for controlling said device,
    wherein said driver applies a pinning voltage to said first and second transfer electrode groups when taking an image, signal charges generated by incident light being accumulated in potential wells equivalent to pixels generated in said channel layer portions underlaying said second and fourth electrodes, and
    wherein said driver applies two-phase clocks having a "L" level of said pinning voltage and an "H" level of a predetermined voltage higher than the pinning voltage to said first and second transfer electrode groups to mix signal charges accumulated in the adjacent two potential wells when transferring charges, whereby each mixed signal is isolated and transferred.

2. An apparatus according to claim 1, wherein said "H" level of at least one of the two-phase clocks is set to a voltage such that the potential difference between the shallowest and the deepest potential wells generated in said channel layer in the case of transferring charges is three times larger than the potential difference between the potential of the barrier layer and the potential generated in said channel layer when the pinning voltage is applied when taking an image.

3. An apparatus according to claim 1, wherein said charged coupled device is a full-frame transfer type charge coupled device.

4. An apparatus according to claim 1, wherein said charge coupled device is a frame transfer type charge coupled device.

5. An image pick-up apparatus comprising:
    a charge coupled device, said charge coupled device including:
        a substrate,
        a channel layer formed in the substrate, for transferring signal charge generated in the device in response to an incident light along with a charge transfer direction,
        at least one transfer electrode group formed on said channel layer, each of said at least one transfer electrode group having at least two electrodes, and
        a barrier layer group formed in said channel layer and located under some but not all electrodes in said at least one transfer electrode group; and
    a driver for controlling said device,
    wherein said driver applies a pinning voltage to said at least one transfer electrode groups when taking an image, signal charges generated by incident light being accumulated in potential wells equivalent to pixels generated in said channel layer portions underlaying some of said electrodes, and
    wherein said driver applies two-phase clocks having a "L" level of said pinning voltage and an "H" level of a predetermined voltage higher than the pinning voltage to said at least one transfer electrode groups to mix signal charges accumulated in the adjacent two potential wells when transferring charges, whereby each mixed signal is isolated and transferred.

6. An apparatus according to claim 5, wherein said "H" level of at least one of the two-phase clocks is set to a voltage such that the potential difference between the shallowest and the deepest potential wells generated in said channel layer in the case of transferring charges is three times larger than the potential difference between the potential of the barrier layer and the potential generated in said channel layer when the pinning voltage is applied when taking an image.

7. An apparatus according to claim 5, wherein said charged coupled device is a full-frame transfer type charge coupled device.

8. An apparatus according to claim 5, wherein said charge coupled device is a frame transfer type charge coupled device.

* * * * *